(12) United States Patent
Sakamori

(10) Patent No.: US 6,686,269 B2
(45) Date of Patent: Feb. 3, 2004

(54) SEMICONDUCTOR DEVICE HAVING IMPROVED CONTACT HOLE STRUCTURE, AND METHOD OF MANUFACTURING THE SAME

(75) Inventor: Shigenori Sakamori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 27 days.

(21) Appl. No.: 10/045,009

(22) Filed: Jan. 15, 2002

(65) Prior Publication Data
US 2002/0056921 A1 May 16, 2002

Related U.S. Application Data

(62) Division of application No. 09/606,153, filed on Jun. 29, 2000, now Pat. No. 6,340,844.

(30) Foreign Application Priority Data
Jan. 12, 2000 (JP) ........................................ 2000-004002

(51) Int. Cl.⁷ ................................................ H01L 21/44
(52) U.S. Cl. ................... 438/615; 438/723; 438/724; 438/738; 438/780; 257/751; 257/752; 257/758; 257/759; 257/762
(58) Field of Search ............................... 438/723, 724, 438/738, 740, 615; 257/751, 752, 758, 759, 762

(56) References Cited

U.S. PATENT DOCUMENTS

| 5,804,862 | A | | 9/1998 | Matumoto |
|---|---|---|---|---|
| 5,883,418 | A | | 3/1999 | Kimura |
| 5,894,170 | A | | 4/1999 | Ishikawa |
| 5,920,793 | A | | 7/1999 | Mizushima |
| 5,925,912 | A | * | 7/1999 | Arai et al. .................. 257/344 |
| 5,933,756 | A | | 8/1999 | Fuse |
| 6,037,664 | A | * | 3/2000 | Zhao et al. ................. 257/758 |
| 6,162,676 | A | | 12/2000 | Mori |
| 6,171,961 | B1 | | 1/2001 | Yamazaki et al. |
| 6,215,189 | B1 | | 4/2001 | Toyoda et al. |
| 6,228,755 | B1 | | 5/2001 | Kusumi et al. |

FOREIGN PATENT DOCUMENTS

| JP | 8-148499 | 6/1996 |
|---|---|---|
| JP | 8-316315 | 11/1996 |
| JP | 1-340953 | 10/1998 |
| JP | 10-340953 | 12/1998 |
| JP | 11-87502 | 3/1999 |
| JP | 11-307628 | 11/1999 |

* cited by examiner

*Primary Examiner*—David Nelms
*Assistant Examiner*—Reneé R. Berry
(74) *Attorney, Agent, or Firm*—McDermott, Will & Emery

(57) ABSTRACT

Within an interlayer dielectric film laid on a semiconductor substrate, a first conducting line is formed at a position lower than a second conducting line. Further, an etching stopper film, which has an etch selectivity differing from that of the interlayer dielectric films under a certain set of etching conditions, is formed at an intermediate position between the first conducting line and the second conducting line. A contact hole to reach the upper second conducting line is formed by etching under the condition that the interlayer dielectric film has a high etch selectivity with respect to the etching stopper film. The depth of a contact hole is controlled not to reach the lower first conducting line in the event the contact hole is offset from a upper conducting line.

9 Claims, 5 Drawing Sheets

SEMICONDUCTOR DEVICE HAVING IMPROVED CONTACT HOLE STRUCTURE, AND METHOD OF MANUFACTURING THE SAME This application is a divisional of application Ser. No. 09/606,153 filed Jun. 29, 2000 now U.S. Pat. No. 6,340,844.

BACKGROUND OF THE INVENTION

1. Field of the Invention

The present invention relates to a semiconductor device, such as an IC or a LSI device, having contact holes. More particularly, the present invention relates to a semiconductor device in which the depth of a contact hole is controlled in the event the contact hole is offset from a lower conducting line. The present invention further relates to a method of manufacturing the contact holes, and more particularly, to a method of controlling the etching depth of a contact hole in the event of a contact hole is offset from a lower conducting line.

2. Background Art

In association with miniaturization of a semiconductor element, it has become difficult to ensure a sufficient overlay margin between a contact hole and a lower conducting line or a like conducting element. For this reason, as in the case of a conventional semiconductor device shown in FIGS. 9 and 10, a contact hole happens to be offset from a lower electrode with which the contact hole is to be electrically connected. At this time, if the depth of etching is great, the contact hole may reach a lower electrode with which the contact hole should not be connected; that is, a lower electrode or a substrate.

FIGS. 9 and 10 are cross-sectional views showing example conventional semiconductor devices in which a contact hole is offset from a conducting line with which the contact hole is to be connected.

In FIGS. 9 and 10, reference numeral 101 designates a semiconductor substrate; 102 designates an element isolation region; 103 designates a first conducting line or a first electrode line; 104 designates an interlayer dielectric film to be formed on the first conducting line 103; 107 designates a second conducting line or a second electrode line; 108 designates an interlayer dielectric film to be formed on the second conducting line 107; 109 designates a photoresist mask to be used for forming a contact hole; 110 designates a contact hole pattern; and 111 designates the extra etching amount "r," which would result when the contact hole is brought out of alignment with the second conducting line 107.

In the case of the conventional semiconductor device shown in FIG. 9, a sufficient margin between the first conducting line 103 and the second conducting line 107; i.e., a sufficient layout interval between these conducting lines, is ensured for counting occurrence of an offset of the contact hole 110. Further, in the case of the conventional semiconductor device shown in FIG. 10, a pattern for the first conducting line 103 is designed to be sufficiently wide so as to prevent the contact hole 110 from being offset from the first conducting line 103. Both methods pose a problem of an increase in the area of a chip.

SUMMARY OF THE INVENTION

The present invention has been conceived to solve such a drawback of the background art and is aimed at providing a semiconductor device which has a contact hole of which depth is controlled when the contact hole is offset from a lower conducting line. The present invention is further aimed at providing a method of controlling the depth of etching in the event of a contact hole being offset from a lower conducting line during the course of etching of the contact hole.

According to one aspect of the present invention, a semiconductor device comprises a semiconductor substrate and a interlayer insulation film formed on the semiconductor substrate. A first conductor line formed at a relatively lower position within an interlayer dielectric film laid. A second conductor line formed at a relatively higher position within the interlayer dielectric film. An etching stopper film is formed within the interlayer dielectric film at an intermediate position between the first and second conductor lines, and the etching stopper film has an etch selectivity differing from that of the interlayer dielectric film for a predetermined etching condition. A contact hole is formed in the interlayer dielectric film so as to extend from the surface of the interlayer dielectric film to reach the second conducting line, and the offset portion of the contact hole from the second conducting line extends toward the etching stopper film, and terminates at longest at the etching stopper film. Further, a contact conductor is filled in the contact hole.

According to another aspect of the present invention, a semiconductor device comprises a semiconductor substrate and an interlayer insulation film formed on the semiconductor substrate. A first conductor line is formed at a relatively lower position within an interlayer dielectric film laid. A second conductor line is formed at a relatively higher position within the interlayer dielectric film. An etching stopper film is formed within the interlayer dielectric film at a position higher than the second conductor line, and the etching stopper film has an etch selectivity differing from that of the interlayer dielectric film for a predetermined etching condition. A contact hole is formed in the interlayer dielectric film so as to extend from the surface of the interlayer dielectric film to reach the second conductor line through the etching stopper film, and the offset portion of the contact hole from the second conductor line extends toward the semiconductor substrate, and terminates before reaching the semiconductor substrate. Further, a contact conductor is filled in the contact hole.

According to another aspect of the present invention, a semiconductor device comprises a semiconductor substrate and an interlayer insulation film formed on the semiconductor substrate. A first conductor line is formed at a relatively lower position within an interlayer dielectric film laid. A second conductor line is formed at a relatively higher position within the interlayer dielectric film. A first etching stopper film is formed within the interlayer dielectric film at an intermediate position between the first and second conductor lines. A second etching stopper film is formed within the interlayer dielectric film at a position higher than the second conductor line. The first and second etching stopper films have an etch selectivity differing from that of the interlayer dielectric film for a predetermined etching condition. A contact hole is formed in the interlayer dielectric film so as to extend from the surface of the interlayer dielectric film to reach the second conducting line through the second etching stopper film, and the offset portion of the contact hole from the second conducting line extends toward the first etching stopper film, and terminates at longest at the first etching stopper film. Finally, a contact conductor is filled in the contact hole.

Other and further objects, features and advantages of the invention will appear more fully from the following description.

DETAILED DESCRIPTION OF THE PREFERRED EMBODIMENTS

Figure 1:
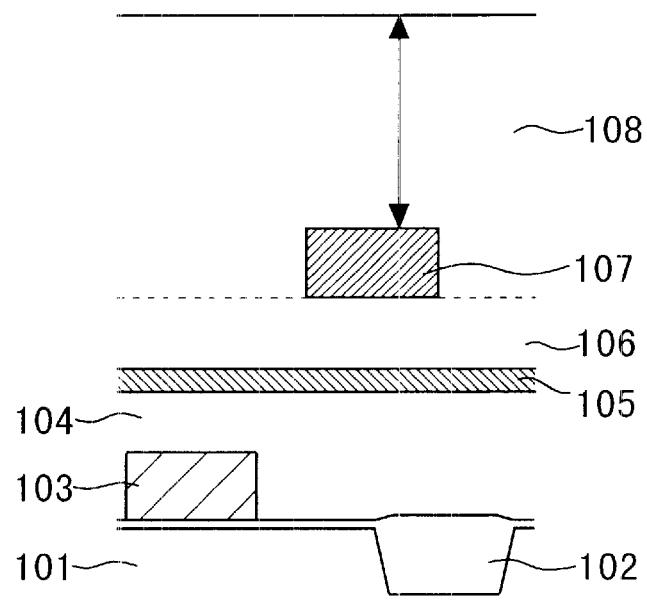
FIGS. 1 and 2 are cross-sectional views for describing a semiconductor device and a method of manufacturing the same according to a first embodiment of the present invention.

Preferred embodiments of the present invention will be described hereinbelow by reference to the accompanying drawings. Throughout the drawings, like reference numerals designate like or corresponding elements, and repeated explanations thereof are simplified or omitted for brevity.

First Embodiment

Figure 2:
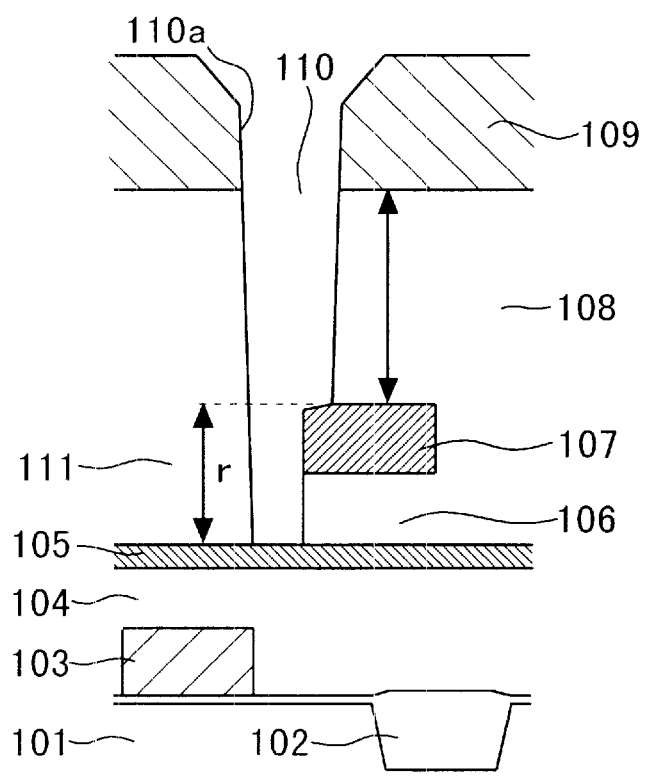

FIGS. 1 and 2 are cross-sectional views for describing a semiconductor device according to a first embodiment of the present invention and a method of manufacturing the same.

In FIGS. 1 and 2, reference numeral 101 designates a semiconductor substrate (e.g., a silicon semiconductor substrate); 102 designates an element isolation region formed in the surface of the semiconductor substrate 101; 103 designates a first conducting line or a first electrode line formed on the surface of the semiconductor substrate 101 or on a thin dielectric film laid on the surface of the semiconductor substrate 101; 104 designates an interlayer dielectric film (e.g., a silicon oxide film) formed on the semiconductor substrate 101 and the first conducting line 103; 105 designates an etching stopper film (e.g., a silicon nitride film) formed on the interlayer dielectric film 104; 106 designates an interlayer dielectric film (e.g., a silicon oxide film) formed on the etching stopper film 105; 107 designates a second conducting line or a second conducting line formed in or on the interlayer dielectric film 106; 108 designates an interlayer dielectric film formed on the interlayer dielectric film 106 or on the second conducting line 107; 109 designates a photoresist mask to be used for forming a contact hole; 110 designates a contact hole formed in the interlayer dielectric films 106 and 108; 110a designates a contact hole pattern; and 111 designates the extra etching amount (denoted by symbol "r") which would be brought about when the contact hole 110 is brought out of alignment with the second conducting line 107. In other words, reference numeral 111 designates an extra length of the offset portion of the contact hole 110. Hereinafter, the interlayer dielectric films 104, 106, and 108 will be hereinafter generically and simply called an interlayer dielectric film, as required.

Further, a contact conductor is filled in the contact hole although not shown in the drawings.

As mentioned above, according to the method of manufacturing a semiconductor device of the present invention, within the interlayer dielectric films 104, 106, and 108 laid on the semiconductor substrate 101, the first conducting line 103 is formed at a position lower than the second conducting line 107. Further, the etching stopper film 105 is formed at an intermediate position between the first conducting line 103 and the second conducting line 107. Material, whose etch selectivity differs from that of the interlayer dielectric film under predetermined conditions, is chosen for the etching stopper film 15. The contact hole (opening) 110 is formed in the interlayer dielectric film so as to extend from the surface thereof to the second conducting line 107, to extend to a position not reaching the etching stopper film 105 after having passed the second conducting line 107, or to extend to the etching stopper film 105 after having passed the second conducting line 107.

Preferably, under the predetermined etching conditions used for manufacturing the semiconductor device, the interlayer dielectric film has a high etch selectivity with respect to the etching stopper film 105. For example, an etch selectivity ranging from 10 to 15 is selected such that the etch selectivity does not exceed a value of 15.

The contact hole 110 may be positioned in a way that the hypothetical extension of the offset portion may run into the underlying first conducting line 103.

Next will be described a method of manufacturing the semiconductor device.

As shown in FIG. 1, the element isolation region 102 is formed into a desired pattern on the semiconductor substrate 101. Material which is to form the first conducting line 103 is deposited on the substrate 101 or the wafer, and a desired resist is patterned onto the wafer. The wafer is then dry etched, whereby the first conducting line 103 is formed. Further, a silicon oxide film is deposited on the wafer and is subjected to smoothing, thus forming the interlayer dielectric film 104. Subsequently, a silicon nitride film is deposited on the wafer to a thickness of 30 to 80 nm, thus forming the etching stopper film 105 (i.e., an etching stopper). A silicon oxide film is then deposited on the wafer to a thickness of about 100 to 200 nm, thus forming the interlayer dielectric film 106.

Next, material which is to form the second conducting line 107; for example, a tungsten (W)/barrier metal (TiN/Ti) film, is deposited on the wafer to a thickness of 100 nm. A desired resist is patterned on the wafer, and the wafer is dry etched, thus forming the second conducting line 107. Subsequently, a silicon oxide film is deposited and smoothed, thus forming the interlayer dielectric film 108. Finally, there is obtained the wafer having the structure as defined in FIG. 1.

As shown in FIG. 2, there is formed a resist pattern 109 having a desired contact hole pattern 110a therein.

Subsequently, the interlayer dielectric films 106 and 108 are etched in a manner as will be described below, thereby enabling control of the extra etching amount 111 (denoted by symbol "r") resulting from an offset of the contact hole 110.

The interlayer dielectric films 106 and 108 are etched for forming an opening under the condition that there is ensured a predetermined etch selectivity of the interlayer dielectric films 106 and 108 to the etching stopper film 105, thereby enabling control of the extra etching amount 111 ("r") resulting from an offset in the contact hole 110.

If the etching stopper film 105 has sufficient etch selectivity, etching of the contact hole 110 is stopped, thus preventing formation of the contact hole 110 in the interlayer dielectric film 104. Accordingly, a pattern can be formed in the wafer without involvement of occurrence of a short circuit between the first conducting line 103 and the second conducting line 107 by way of the contact hole 110.

Occurrence of a short circuit between the first and second conducting lines 103 and 107 cannot be prevented with complete reliability. For example, given that the etching stopper film 105 has an etch selectivity of 10 and a thickness of 300 nm, the contact hole 110 will not pass through the etching stopper film 105 unless the etching stopper film 105 is over-etched by 300 nm (=30 nm×selectivity of 10) or more. More specifically, the contact hole 110 will not penetrate through the etching stopper film 105 if the amount of over-etching of the contact hole 110 is less than the total sum of the thickness of the interlayer film 108, the thickness of the second conducting line 107, the thickness of the interlayer film 106, and a thickness of 300 nm.

Assuming that the interlayer dielectric film 108 has a thickness of 2 $\mu$m and that the amount of over-etching required for eliminating variations which arise in the thickness of the interlayer dielectric film, etch uniformity, and etch reproducibility during etching is 40% of 2 $\mu$m, the total amount of etching will be 2.8 $\mu$m which is greater than the total thickness of 2.6 $\mu$m [=2 $\mu$m+100 nm (the thickness of the second conducting line 107) +200 nm (the thickness of the first conducting line 105) +300 nm], with the result that the contact hole 110 penetrates through the etching stopper film 105.

If the thickness of the interlayer dielectric film 108 is set so as to satisfy the foregoing requirement, the contact hole 110 can be formed without penetrating through the etching stopper film 105. Since a necessity for ensuring a layout margin between the first conducting line 103 and the second conducting line 107 is eliminated, a semiconductor element can be miniaturized. Further, since occurrence of a short circuit can be prevented, the semiconductor device can be manufactured at improved yield.

The method of manufacturing a semiconductor device of the present invention as described above may be restated as follows. Within the interlayer dielectric films 104, 106, and 108 laid on the semiconductor substrate 101, the first conducting line 103 is formed at a position lower than the second conducting line 107. Further, the etching stopper film 105, which has an etch selectivity differing from that of the interlayer dielectric film under a certain set of etching conditions, is formed at an intermediate position between the first conducting line 103 and the second conducting line 107. Subsequently, an opening as a contact hole is formed in the interlayer dielectric film so as to extend from the surface thereof to the second conducting line 107, or to extend to a position not reaching the etching stopper film 105 after having passed the second conducting line 107, or to extend to the etching stopper film 105 after having passed the second conducting line 107.

Preferably, the opening is etched under the condition that the interlayer dielectric film has a high etch selectivity with respect to the etching stopper film 105.

More desirably, the opening is etched under the condition that the interlayer dielectric film has a high etch selectivity with respect to the etching stopper film 105; preferably, an etch selectivity ranging from 10 to 15, and the etch selectivity does not exceed a value of 15.

The contact hole 110 may be formed at a positioned that the hypothetical extension of the offset portion of the contact hole may run into the underlying first conducting line 103.

Further, a contact conductor is filled in the contact hole although not shown in the drawings.

Second Embodiment

Figure 3:
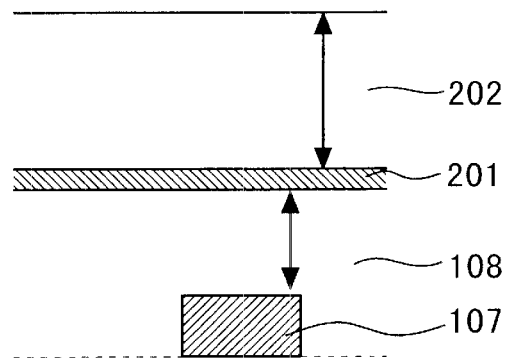
FIGS. 3 and 4 are cross-sectional views for describing a semiconductor device and a method of manufacturing the same according to a second embodiment of the present invention.
Figure 3:
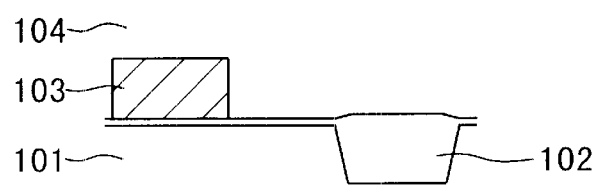
Figure 4:
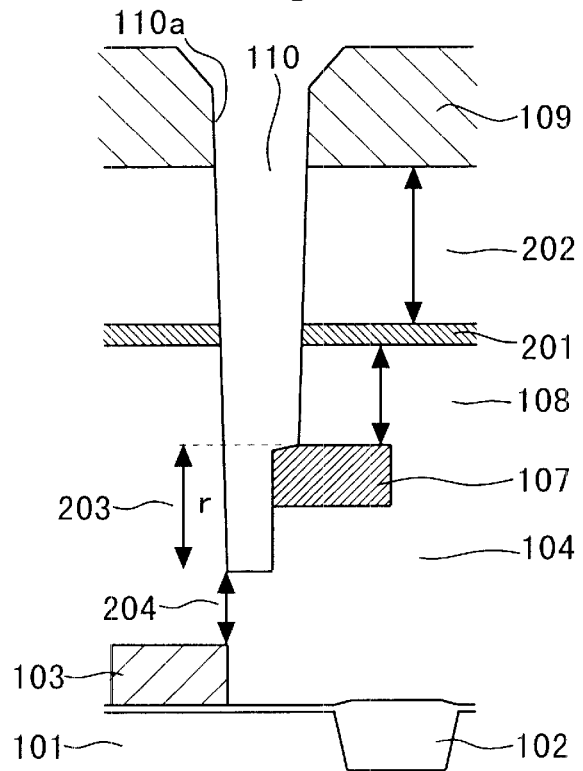

FIGS. 3 and 4 are cross-sectional views for describing a semiconductor device according to a second embodiment of the present invention and a method of manufacturing the same.

In FIGS. 3 and 4, reference numerals 101 to 110 designate the same elements as shown in FIGS. 1 and 2. The etching stopper film 105 and the interlayer dielectric film 106 shown in FIGS. 1 and 2 are omitted from the semiconductor device of the present embodiment. Further, the second conducting line or second electrode line 107 is formed on the interlayer dielectric film 104.

Reference numeral 201 designates an etching stopper film (e.g., a silicon nitride film) formed on the interlayer dielectric film 108; 202 designates an interlayer dielectric film (e.g., a silicon oxide film) formed on the etching stopper film 201; 203 designates the extra etching amount (denoted by symbol "r") of the contact hole 110; and 204 designates a margin (interval) between the bottom of the contact hole 110 and the first conducting line 103. Hereinafter, the interlayer dielectric films 104, 106, and 108 will each be collectively and simply called an interlayer dielectric film, as required.

The structure of the semiconductor device according to the present embodiment is suitable for use when the interlayer film 202 is thick.

As mentioned above, according to the method of manufacturing a semiconductor device of the present invention, within the interlayer dielectric films 104, 108, and 202 laid on the semiconductor substrate 101, the first conducting line 103 is formed at a position lower than the second conducting line 107. Further, the etching stopper film 201 is formed in the interlayer dielectric film at a position higher than the second conducting line 107. Material, whose etch selectivity differs from that of the interlayer dielectric film under selected, predetermined conditions, is chosen for the etching stopper film 201. The contact hole (opening) 110 is formed in the interlayer dielectric film so as to extend from the surface thereof to the second conducting line 107 after having passed the etching stopper film 201, or to extend to a position before reaching the first conducting line 103 after having passed the second conducting line 107. As a matter of course, conductive material is finally embedded in the contact hole 110.

Preferably, under the predetermined etching conditions used for manufacturing the semiconductor device, the interlayer dielectric film has a high etch selectivity with respect to the etching stopper film 201. For example, an etch selectivity is selected from a range of 10 through 15 such that the etch selectivity does not exceed a value of 15.

The contact hole 110 may be positioned in a way that the hypothetical extension of the offset portion may run into the underlying first conducting line 103.

Next will be described a method of manufacturing the semiconductor device.

After the first conducting line 103 has been formed on the semiconductor substrate 101, a silicon oxide film is deposited on the wafer and is subjected to smoothing, thus forming the interlayer dielectric film 104. Subsequently, material which is to form the second conducting line 107; for example, a tungsten (W)/barrier metal (TiN/Ti) film, is deposited on the wafer to a thickness of 100 nm. A desired resist is patterned on the wafer, and the wafer is dry etched, thus forming the second conducting line 107. A silicon oxide film is deposited to a great thickness and smoothed by means of chemical-and-mechanical (CMP) polishing, thus forming the interlayer dielectric film 108 to a thickness of 100 to 200 nm. Further, a nitride film which is to form the etch stopper 201 is deposited on the wafer to a thickness of 50 to 90 nm, thus forming the etching stopper film 201. Subsequently, a silicon oxide film is deposited on the wafer, and the wafer is subjected to smoothing, thereby forming the interlayer dielectric film 202. Thus, there is obtained the wafer having the structure as defined in FIG. 3.

As shown in FIG. 4, there is formed a resist pattern 109 having a desired contact hole pattern 10a therein.

Subsequently, the interlayer dielectric film 202, the etching stopper film 201, and the interlayer dielectric films 106 and 108 are etched in a manner as will be described below, thereby enabling control of the extra etching amount 203 (denoted by symbol "r") resulting from an offset of the contact hole 110. The method of the present embodiment is suitable for use with the thick interlayer film 202.

Under the condition that the interlayer dielectric film 202 has a high etch selectivity (of 10 to 15) with respect to the etching stopper film 201 (i.e., a etching stopper film), the interlayer dielectric film 202 is etched to the etching stopper film 201. At this time, the etching stopper film 201 can absorb variations in the thickness of the interlayer dielectric film 202 and variations in etch rate. In a case where the interlayer dielectric film 202 has a thickness of 1.6 $\mu$m, a variation of ±10% arises in the thickness of the interlayer dielectric film 202, a variation of ±20% arises in an etch rate of the interlayer dielectric film 202, and a variation of 480 nm [=1.6 $\mu$m×(0.1+0.2)] arises in the depth of etching of the interlayer dielectric film 202. Provided that the etching stopper film (e.g., a nitride film) 201 has a thickness of 50 nm and the interlayer dielectric film 202 has an etch selectivity of 10, a variation substantially equal to 500 nm can be diminished to 50 nm corresponding to the thickness of the etching stopper film 201.

Following the above etching process, the wafer is etched such that the etch selectivity of the interlayer dielectric films 108 and 202 to the etching stopper film 201 assumes a value of 1. At this time, the amount of etching is set on the basis of the total thickness of the etching stopper film 201 and the interlayer dielectric film 108. Accordingly, in contrast with a semiconductor device which does not include the etching stopper film 201 and in which the interlayer dielectric films 108 and 202 are etched simultaneously, the semiconductor device of the present embodiment enables better control of and a decrease in the extra etching amount (r) 203.

In a case where the interlayer dielectric film 202 is etched under the condition that the interlayer dielectric film 202 has a high etch selectivity (ranging from 10 to 15) with respect to the etching stopper film 201, a deposition film will be excessively deposited on the etching stopper film 201. In the next step, the deposition film hinders etching of the etching stopper film 201 and the interlayer dielectric film 108, thus causing formation of a partially-unopened contact hole. For this reason, when the interlayer dielectric film 202 is etched to the etching stopper film 201, the interlayer dielectric film 202 preferably assumes an etch selectivity of 10 to 15.

As mentioned above, the margin 204 between the contact hole 110 and the first conducting line 103 can be controlled, thereby enabling formation of a pattern without occurrence of a short circuit between the first and second conducting lines 103 and 107 by way of the contact hole 110. Consequently, a semiconductor element can be miniaturized, and occurrence of a short circuit in a semiconductor element can be prevented, thereby enabling manufacture of the semiconductor device at improved yield.

The method of manufacturing a semiconductor device of the present invention as described above may be restated as follows. Within the interlayer dielectric films 104, 108, and 202 laid on the semiconductor substrate 101, the first conducting line 103 is formed at a position lower than the second conducting line 107. Further, the etching stopper film 201 whose etch selectivity differs from that of the interlayer dielectric film under selected, predetermined conditions is formed in the interlayer dielectric film at a position higher than the second conducting line 107. A contact hole (opening) is formed in the wafer so as to extend from the surface of the interlayer dielectric film to the etching stopper film 201 (a first opening step). Next, the contact hole (opening) is extended to a greater depth so as to extend to the second conducting line 107 after having penetrated through the etching stopper film 201 and the interlayer dielectric film underlying the etching stopper film 201, or to extend to a position before reaching the first conducting line 103 after having penetrated through the second conducting line 107 (a second opening step).

Preferably, processing pertaining to the first opening step is performed under the condition that the interlayer dielectric film 202 assumes a high etch selectivity with respect to the etching stopper film 201. Processing pertaining to the second opening step is performed under the condition that the interlayer dielectric film assumes a low etch selectivity with respect to the etching stopper film 201.

More preferably, processing pertaining to the first opening step is performed under the condition that the interlayer dielectric film has a high etch selectivity with respect to the etching stopper film 201; for example, an etch selectivity of 10 to 15, and that the etch selectivity does not exceed a value of 15.

The contact hole 110 may be formed at a positioned that the hypothetical extension of the offset portion of the contact hole may run into the underlying first conducting line 103.

Third Embodiment

Figure 5:
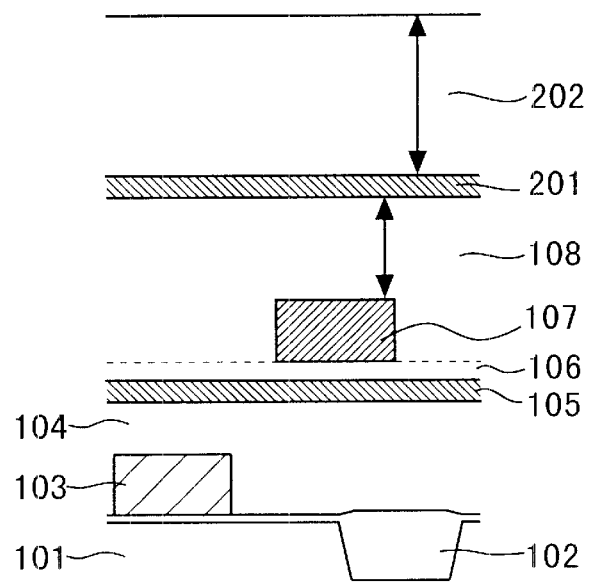
FIGS. 5 and 6 are cross-sectional views for describing a semiconductor device and a method of manufacturing the same according to a third embodiment of the present invention.
Figure 6:
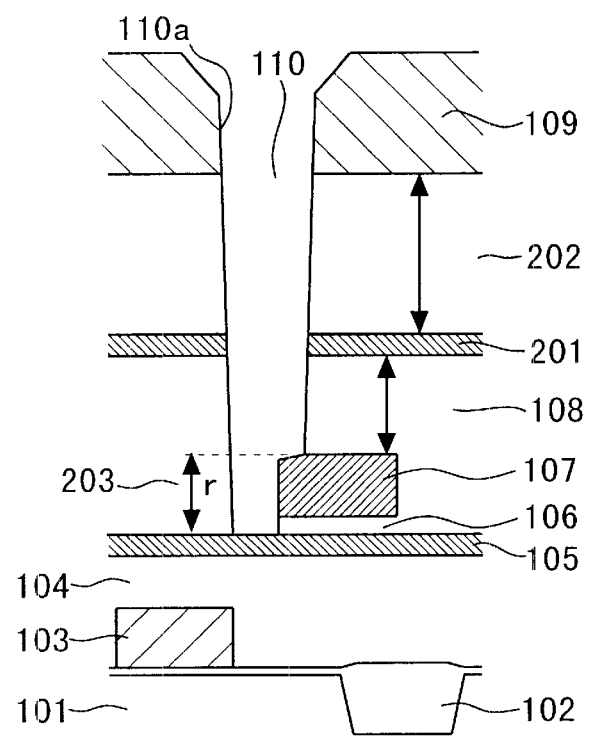

FIGS. 5 and 6 are cross-sectional views for describing a semiconductor device according to a third embodiment of the present invention and a method of manufacturing the same.

In FIGS. 5 and 6, reference numerals 101 to 110 and 201 through 203 designate the same elements as shown in FIGS. 1 through 4. Hereinafter, the interlayer dielectric films 104, 106, 108, and 202 will each be collectively and simply called an interlayer dielectric film, as required.

The semiconductor device of the present embodiment is formed from a combination of the semiconductor device of the first embodiment and the semiconductor device of the second embodiment. The structure of the semiconductor device according to the present embodiment is suitable for use with thick interlayer films 108 and 202.

As mentioned above, according to the method of manufacturing a semiconductor device of the present invention, within the interlayer dielectric films 104, 106, 108, and 202 laid on the semiconductor substrate 101, the first conducting line 103 is formed at a position lower than the second conducting line 107. Further, the first etching stopper film 105 is provided at an intermediate position between the first conducting line 103 and the second conducting line 107, and the second etching stopper film 201 is provided at a position higher than the second conducting line 107. Material, whose etch selectivity differs from that of the interlayer dielectric film under selected, predetermined conditions, is chosen for the etching stopper films 105 and 201. The contact hole (opening) 110 is formed in the interlayer dielectric film so as to extend from the surface thereof to the second conducting line 107 after having passed the second etching stopper film 201, or to extend to a position not reacing the first etching stopper film 105 after having passed the second conducting line 107, or to extend to the first etching stopper film 105.

Preferably, under the predetermined etching conditions used for manufacturing the semiconductor device, the interlayer dielectric film has a high etch selectivity with respect to the etching stopper films 105 and 201. For example, an etch selectivity is selected from a range of 10 through 15 such that the etch selectivity does not exceed a value of 15.

The contact hole 110 may be positioned in a way that the hypothetical extension of the offset portion may run into the underlying first conducting line 103.

Next will be described a method of manufacturing the semiconductor device.

In the present embodiment, a semiconductor device having the structure shown in FIGS. 5 and 6 is manufactured according to a combined process consisting of the process according to the first embodiment and the process according to the second embodiment. Detailed description of the process is omitted here. The structure of the semiconductor device according to the present embodiment is suitable for use when the interlayer dielectric films 108 and 202 are thick.

First, by use of the processes described in connection with the first and second embodiments, the structure of the semiconductor device shown in FIG. 5 will be embodied. Then, as shown in FIG. 6, there is formed the resist pattern 109 having a desired contact hole pattern 110*a* formed therein.

Through the same processes as employed in the second embodiment, the interlayer dielectric film 202 is etched to the etching stopper film 201 under the condition that the interlayer dielectric film 202 has a high etch selectivity with respect to the etching stopper film 201. As a result, variation in the depth of etching of the interlayer dielectric film 202 can be diminished, as in the case of the second embodiment.

Following the etching process, the etching stopper film 201 is further etched under the condition that the interlayer dielectric film 202 has a low etch selectivity with respect to the etching stopper film 201.

After the etching stopper film 201 has been etched thoroughly, the interlayer dielectric film 108 is etched under the condition that the interlayer dielectric film 108 has a high etch selectivity with respect to the etch stopper 105, thereby terminating the etching of the contact hole 110 at the stopper film 105.

Even when the interlayer dielectric films 108 and 202 are thick, a contact hole can be formed while the extra etching amount 203 (denoted by symbol "r") is controlled.

As mentioned, since a margin between the contact hole 110 and the first conducting line 103 can be controlled, a pattern can be formed without involvement of occurrence of a short circuit between the first and second conducting lines 103 and 107 by way of the contact hole 110. Accordingly, miniaturization of a semiconductor element and prevention of occurrence of a short circuit can be achieved, thus manufacturing the semiconductor device at improved yield.

As described above, according to the method of manufacturing a semiconductor device of the present invention, within the interlayer dielectric films 104, 106, 108, and 202 laid on the semiconductor substrate 101, the first conducting line 103 is formed at a position lower than the second conducting line 107. Further, the first etching stopper film 105 whose etch selectivity differs from that of the interlayer dielectric film under selected, predetermined conditions is provided at an intermediate position between the first conducting line 103 and the second conducting line 107. Moreover, the second etching stopper film 201, whose etch selectivity differs from that of the interlayer dielectric film under selected, predetermined conditions, is provided at a position higher than the second conducting line 107. A contact hole 110 (opening) is formed in the wafer so as to extend from the surface of the interlayer dielectric film to the second etching stopper film 201 (a first opening step). Next, the second etching stopper film 201 is etched by way of the opening formed above (a second opening step). The opening 110 is formed to a greater depth so as to extend to the second conducting line 107 after having penetrated through the dielectric film underlying the second etching stopper film 201, or to extend to a position after having passed the second conducting line 107, or to extend to the first etching stopper film 105 having penetrated through the dielectric film (a third opening step).

Preferably, processing pertaining to the first opening step is performed under the condition that the interlayer dielectric film 202 assumes a high etch selectivity with respect to the etching stopper film 201. Processing pertaining to the second opening step is performed under the condition that the interlayer dielectric film assumes a low etch selectivity with respect to the etching stopper film 201. Processing pertaining to the third opening step is performed under the condition that the interlayer dielectric film has a high etch selectivity with respect to the first etching stopper film 105.

More preferably, processing pertaining to the first and third opening steps is performed under the conditions that the interlayer dielectric film has a high etch selectivity with respect to the etching stopper films 105 and 201; for example, an etch selectivity of 10 to 15, and that the etch selectivity does not exceed a value of 15.

The contact hole 110 may be formed at a positioned that the hypothetical extension of the offset portion of the contact hole may run into the underlying first conducting line 103.

Fourth Embodiment

Figure 7:
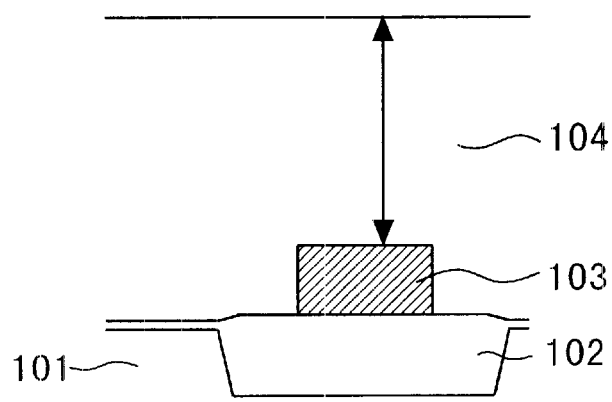
FIGS. 7 and 8 are cross-sectional views for describing a semiconductor device and a method of manufacturing the same according to a fourth embodiment of the present invention.
Figure 8:
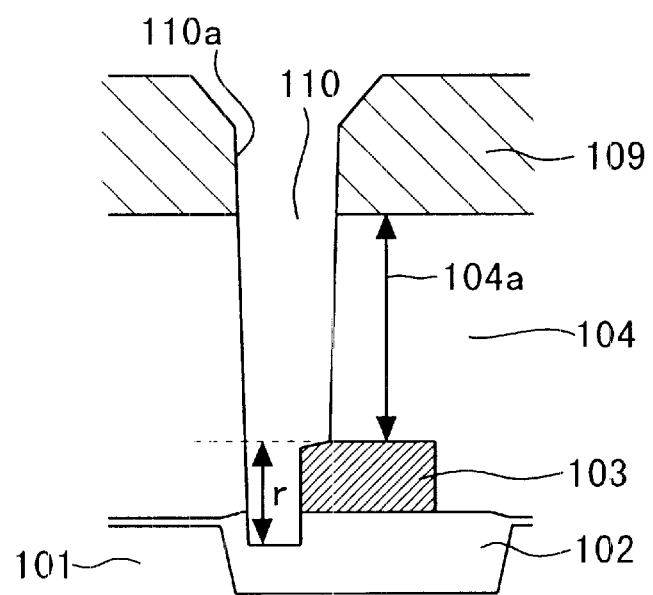
Figure 9:
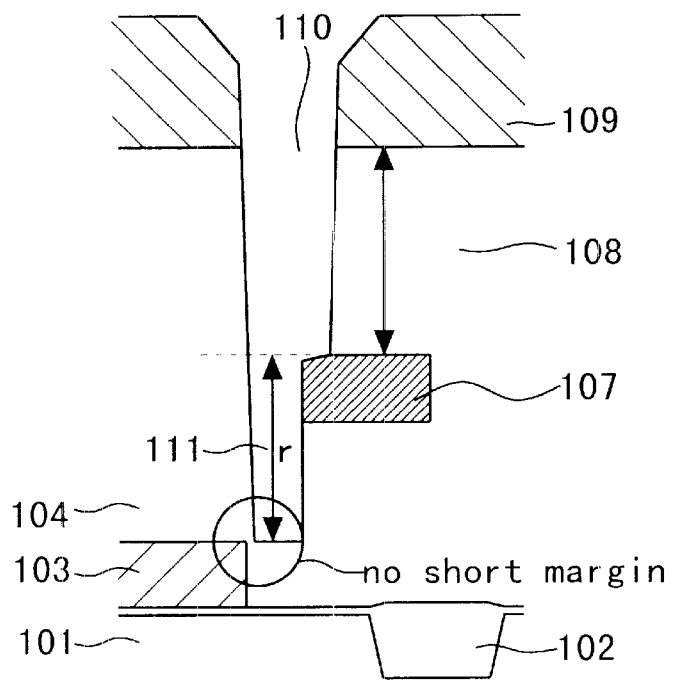
FIGS. 9 and 10 are cross-sectional views showing conventional semiconductor devices.
Figure 10:
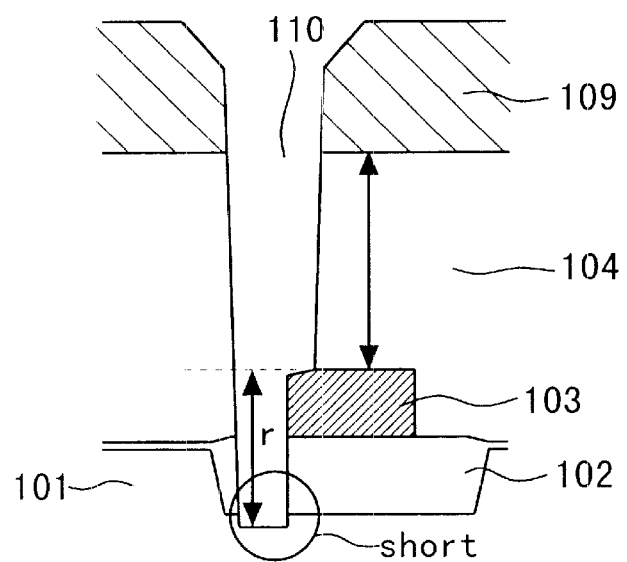

FIGS. 7 and 8 are cross-sectional views for describing a semiconductor device according to a fourth embodiment of the present invention and a method of manufacturing the same. In FIGS. 7 and 8, reference numerals 101 to 104 and 109 through 110 designate the same elements as shown in FIGS. 1 through 6. The structure of a semiconductor device according to the present embodiment is used for a case where an etching stopper film is not formed.

A method of manufacturing the semiconductor device according to the present invention is now described. As shown in FIG. 7, the element isolation region 102 is formed into a desired pattern on the semiconductor substrate 101. Material which is to form the first conducting line 103 is deposited on the element isolation region 102, and a desired resist is patterned on the wafer. The wafer is then dry etched, thus forming the first conducting line 3. Further, a silicon oxide film is deposited on the wafer, and the wafer is smoothed, to thereby form the interlayer dielectric film 104.

As shown in FIG. 8, the resist pattern 109 having a desired contact hole pattern 110*a* formed thereon is formed on the interlayer dielectric film 104.

The interlayer dielectric film 104 is then etched, as will be described later, to thereby control the extra etching amount "r" of the contact hole 110 formed through etching.

The amount of etching of the interlayer dielectric film 104 is set to be greater than the sum of a thickness 104a to which the interlayer dielectric film 104 is to be etched, variations in the thickness of the interlayer dielectric film 104, and variations in the amount of etching. Simultaneously, the amount of etching of the interlayer dielectric film 104 is set to be smaller than the sum of the thickness 104a to which the interlayer dielectric film 104 is to be etched, the extra etching amount "r," variation in the thickness of the interlayer dielectric film 104, and variations in the amount of etching.

More specifically, the contact hole 110 is formed to a depth in accordance with constraint condition sets (1) or (2) provided below, thereby enabling formation of the contact hole 110 without penetrating through the isolation oxide film 102. The allowable extra etching amount "r" is set to a value at which the contact hole 110 does not reach the semiconductor substrate 101.

Constraint Condition Set (1) (a method of adding variations to the amount of etching)

Thickness $104a+\Delta d <$ a set amount of etching $<$ thickness $104a+r+\Delta d$ (where $\Delta d = \Delta T_{104} + \Delta E$)

$\Delta T_{104}$=(variations in thickness 104a)

$\Delta E$=(variations in the amount of etching)

Constraint Condition Set (2) (a method under which variation in the thickness of an interlayer dielectric film and variations in the amount of etching are taken as independent events and are taken into account in the form of a root mean square value)

Thickness $104a+\Delta d' <$ a set amount of etching $<$ thickness $104a+r+\Delta d'$ $\Delta d' = \sqrt{(\Delta T_{104})^2 + (\Delta E)^2}$, $\Delta T_4$=(variations in the thickness 104a), $\Delta E$=(variations in the amount of etching).

The only requirement is that the amount of etching and the thickness of the interlayer dielectric film are determined so as to satisfy either constraint requirements (1) or (2).

So long as the amount of etching of the interlayer dielectric film is set as mentioned above, a pattern can be formed without involvement of the contact hole 110 penetrating through the element isolation region 102. Therefore, there is eliminated a necessity for making a pattern large in order to prevent the contact hole 110 from being offset from the first conducting line 103 when the contact hole 110 is connected to the first conducting line 103.

As a result, miniaturization of a semiconductor device and prevention of occurrence of a short circuit in a semiconductor device can be achieved, thereby manufacturing the semiconductor device at improved yield. Further, a layout margin between a contact hole and a conducting line can be reduced.

Although the present embodiment has described the case where the first conducting line 103 is formed on the element isolation region 102, the present invention can also be applied to a case where an element corresponding to the first conducting line 103 is formed on another dielectric film of predetermined thickness, as well as on the element isolation region 102, which permits a certain amount of extra etching "r" of a contact hole.

The method of manufacturing a semiconductor device of the present invention as described above may be restated as follows. In a method of manufacturing a semiconductor device, a conductor line is formed in an interlayer dielectric film laid on a semiconductor substrate. A contact conductor is formed by filling a contact hole formed in the interlayer dielectric film. The contact hole is formed so as to extend from the surface of the interlayer dielectric film to reach the conductor line. In forming a contact hole, the amount of etching of the interlayer dielectric film is set to be greater than the sum of the thickness of the interlayer dielectric film, variations in the thickness of the interlayer dielectric film, and variations in the amount of etching. The amount of etching of the interlayer dielectric film is set to be smaller than the sum of the thickness of the interlayer dielectric film, the amount of removal, variations in the thickness of the interlayer dielectric film, and variations in the amount of etching.

Fifth Embodiment

A fifth embodiment is directed to preventing use of a high etch selectivity of 15 or more as a condition under which the contact hole 110 is etched while the interlayer dielectric film 202 has a high etch selectivity with respect to the etch stop film 201.

If the etch selectivity is excessively high, a deposition film will be deposited on the surface of the etching stopper film 201. In the next step, the deposition film hinders etching of the etching stopper film 201, thus causing a failure in formation of an opening. For this reason, the contact hole 110 is etched under the conditions that the interlayer dielectric film 202 has a high etch selectivity with respect to the etching stopper film 201; e.g., an etch selectivity of 10 to 15, and that the etch selectivity does not exceed a value of 15.

Accordingly, miniaturization of a semiconductor element and prevention of occurrence of a short circuit can be achieved, thus manufacturing the semiconductor device at improved yield.

Sixth Embodiment

As mentioned previously, in the second or third embodiment, if the interlayer dielectric film has a high etch selectivity of 15 or more with respect to the etching stopper film 201, a deposition film is deposited on the surface of the etching stopper film 201, thus hindering etching of the etching stopper film 201 and causing a failure in formation of an opening.

The sixth embodiment provides a method of preventing occurrence of a failure in an opening even in a case where the interlayer dielectric film has a high etch selectivity of 15 or more.

In contrast with the second and third embodiments, the present embodiment additionally employs a step of removing a deposition film from the inside of the contact hole 110 after the contact hole 110 has been etched while the interlayer dielectric film 202 has an etch selectivity of 15 or more with respect to the etching stopper film 201. Subsequently, the etching stopper film 201 is etched under the condition that the interlayer dielectric film has a low etch selectivity with respect to the etching stopper film 201, preferably under the condition that the interlayer dielectric film has an etch selectivity of 1.

As a result, the etching stopper film 201 can be etched stably. Consequently, a contact hole 110 can be formed without a failure in an opening. Further, through a process in which the interlayer dielectric film has a high etch selectivity with respect to the etching stopper film, the interlayer dielectric film 202 can be made thicker or the etching stopper film 201 can be made thinner.

Consequently, a reduction in the thickness of a stopper film, miniaturization of a semiconductor element, and prevention of occurrence of a short circuit can be achieved, thus manufacturing the semiconductor device at improved yield.

In the previous embodiments, the etching stopper films 105 and 201 are formed over the entire wafer; however, the etching stopper film may be formed in only predetermined locations.

Processing pertaining to the contact hole opening steps 1 through 3 and processing pertaining to the deposition film removal step employed in the previous embodiments may be performed within a single processing chamber.

The features and the advantages of the present invention may be summarized as follows.

According to one aspect, the present invention provides a semiconductor device which comprises a lower position interconnecting line and a higher position interconnecting line formed in interlayer dielectric films. An etching stopper film is located at an intermediate position between the lower and higher interconnecting lines, and the etching stopper film is used to control the degree of extra etching which are brought about by offset of a contact hole from the higher conducting line.

The present aspect of the invention yields the advantages of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

According to another aspect, the present invention provides a semiconductor device which comprises a lower conducting line and a higher conducting line provided in interlayer dielectric films. An etching stopper film is located at a position higher than the higher conducting line, and the etching stopper film is used to control the degree of extra etching which are brought about by offset of a contact hole from the higher conducting line.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

According to another aspect, the present invention provides a semiconductor device which comprises a lower conducting line and a higher conducting line, both conducting lines being provided in interlayer dielectric films, an etching stopper film located at an intermediate position between the lower and higher conducting lines, and another etching stopper film located at a position higher than the higher conducting line, and the etching stopper film is used to control the degree of extra etching which are brought about by offset of a contact hole from the higher conducting line.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

According to another aspect, the present invention provides a method of manufacturing a semiconductor device which comprises the steps of forming a lower conducting line and a higher conducting line in interlayer dielectric films, forming an etching stopper film located at an intermediate position between the lower and higher conducting lines, and forming a contact hole in the higher conducting line, to thereby control the degree of extra etching amount caused by offset of the contact hole from the higher conducting line.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

According to another aspect, the present invention provides a method of manufacturing a semiconductor device which comprises the steps of forming a lower conducting line and a higher conducting line in interlayer dielectric films, forming an etching stopper film located at a position higher than the higher conducting line, and forming a contact hole to reach the higher conducting line, to thereby control the degree of extra etching amount caused by offset of the contact hole from the higher conducting line.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

According to another aspect, the present invention provides a method of manufacturing a semiconductor device which comprises the steps of forming a lower conducting line and a higher conducting line in interlayer dielectric films, forming an etching stopper film located at an intermediate position between the lower and higher conducting lines, forming another etching stopper film at a position higher than the higher conducting line, and forming a contact hole reaching the higher conducting line, to thereby control the degree of extra etching amount caused by offset of the contact hole from the higher conducting line.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

In another aspect, the first interlayer dielectric film is opened preferably at a high etch selectivity of 15 or less.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

In another aspect, the first interlayer dielectric film is opened preferably at a high etch selectivity of 15 or more, and then a deposition film is removed from the opening.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

Further, according to another aspect, the present invention provides a method of manufacturing a semiconductor device, in which, at the time of opening a contact hole reaching an conducting line provided in an interlayer dielectric film, the amount of etching of the interlayer dielectric film is set to be greater than the sum of the thickness of the interlayer dielectric film variations in the thickness of the interlayer dielectric film, and variations in the amount of etching, and to be smaller than the sum of the thickness of the interlayer dielectric film, the extra etching amount "r," variation in the thickness of the interlayer dielectric film, and variations in the amount of etching.

The present aspect of the invention yields the advantage of prevention of occurrence of a short circuit between the contact hole and the lower conducting line, a reduction in a layout margin between the upper and lower conducting lines, miniaturization of a semiconductor element, and an improvement in the yield and reliability of a semiconductor element.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-4002, filed on Jan. 12, 2000 including specification, claims, drawings and summary, on which the Convention priority of the present application is based, are incorporated herein by reference in its entirety.

What is claimed is:

1. A method of manufacturing a semiconductor device comprising the steps of:

forming a first lower interconnection and a second higher interconnection in an interlayer dielectric film laid on a semiconductor substrate, and, at an intermediate position between the first lower interconnection and the second higher interconnection, an etch stopper film whose etch selectivity differs from that of the interlayer dielectric film at a predetermined etching operation; and forming an opening in the interlayer dielectric film so as to extend from the surface of the interlayer dielectric film to the second interconnection, to extend to a position before the etch stopper film after having passed the second interconnection, or to extend to the etch stopper film.

2. The method of manufacturing a semiconductor device according to claim 1, wherein processing pertaining to the step of forming the opening is performed under the condition that the interlayer dielectric film has a high etch selectivity with respect to the etch stopper film.

3. A method of manufacturing a semiconductor device comprising:

a step of forming a first lower interconnection and a second higher interconnection in an interlayer dielectric film laid on a semiconductor substrate, and, at a position higher than the second higher interconnection, an etch stopper film whose etch selectivity differs from that of the interlayer dielectric film for a predetermined etching operation;

a first opening step of forming an opening in the interlayer dielectric film so as to extend from the surface of the interlayer dielectric film to the etch stopper film; and a second opening step of extending the opening such that the opening reaches the second interconnection by means of penetrating through the etch stopper film and the interlayer dielectric film underlying the etch stopper film or extends past the position of the second interconnection.

4. The method of manufacturing a semiconductor device according to claim 3, wherein processing pertaining to the first opening step is performed under the condition that the interlayer dielectric film has a high etch selectivity with respect to the etch stopper film, and processing pertaining to the second opening step is performed under the condition that the interlayer dielectric film has a low etch selectivity with respect to the etch stopper film.

5. A method of manufacturing a semiconductor device comprising:

a step of forming a first lower interconnection and a second higher interconnection in an interlayer dielectric film laid on a semiconductor substrate, and, at an intermediate position between the first and second higher interconnections a first etch stopper film whose etch selectivity differs from that of the interlayer dielectric film for a predetermined etching operation, and, at a position higher than the second higher interconnection, a second etch stopper film whose etch selectivity differs from that of the interlayer dielectric film for a predetermined etching operation;

a first opening step of forming opening in the interlayer dielectric film so as to extend from the surface of the interlayer dielectric film to the second etch stopper film;

a second opening step of etching the second etch stopper film by way of the thus-opened opening; and a third opening step of forming an opening so as to extend from the opening and reach the second interconnection by penetrating through the second etch stopper film, to extend further by passing through the position of the second interconnection, and to extend further to the first etch stopper film.

6. The method of manufacturing a semiconductor device according to claim 5, wherein processing pertaining to the first opening step is performed under the condition that the interlayer dielectric film has a high etch selectivity with respect to the etch stopper film; processing pertaining to the second opening step is performed under the condition that the interlayer dielectric film has a low etch selectivity with respect to the etch stopper film; processing pertaining to the first opening step is performed under the condition that the interlayer dielectric film has a high etch selectivity with respect to the etch stopper film; and processing pertaining to the third opening step is performed under the condition that the interlayer dielectric film has a high etch selectivity with respect to the etch stopper film.

7. The method of manufacturing a semiconductor device according to claim 2, wherein processing pertaining to the first opening step is performed under the condition that the interlayer dielectric film has a high etch selectivity of 15 or less with respect to the etch stopper film.

8. The method of manufacturing a semiconductor device according to claim 4, wherein processing pertaining to the first opening step is performed under the condition that the interlayer dielectric film has a high etch selectivity with respect to the etch stopper film, and a deposition film is removed from the inside of the opening before processing pertaining to the second opening step is performed.

9. A method of manufacturing a semiconductor device comprising the steps of:

forming interconnections in an interlayer dielectric film laid on a semiconductor substrate; and forming an opening so as to extend from the surface of the interlayer dielectric film to the interconnection, wherein the amount of etching of the interlayer dielectric film is set to be greater than the sum of the thickness of the interlayer dielectric film, variations in the thickness of the interlayer dielectric film, and variations in the amount of etching, and to be smaller than the sum of the thickness of the interlayer dielectric film, the amount of removal, variations in the thickness of the interlayer dielectric film, and variations in the amount of etching.

* * * * *